(12) United States Patent
Wang

(10) Patent No.: US 11,239,451 B2
(45) Date of Patent: Feb. 1, 2022

(54) CONDENSING PLATE, VACUUM DRYING DEVICE AND VACUUM DRYING METHOD

(71) Applicant: BOE Technology Group Co., Ltd., Beijing (CN)

(72) Inventor: Huifeng Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 341 days.

(21) Appl. No.: 16/309,738

(22) PCT Filed: Apr. 27, 2018

(86) PCT No.: PCT/CN2018/084715
§ 371 (c)(1),
(2) Date: Dec. 13, 2018

(87) PCT Pub. No.: WO2019/001124
PCT Pub. Date: Jan. 3, 2019

(65) Prior Publication Data
US 2020/0358037 A1     Nov. 12, 2020

(30) Foreign Application Priority Data
Jun. 30, 2017  (CN) .......................... 201710526220.1

(51) Int. Cl.
*B05B 7/16*     (2006.01)
*H01L 51/56*   (2006.01)
(Continued)

(52) U.S. Cl.
CPC ............ *H01L 51/56* (2013.01); *B41J 11/002* (2013.01); *B41M 7/009* (2013.01); *H01L 51/0026* (2013.01)

(58) Field of Classification Search
None
See application file for complete search history.

(56) References Cited

U.S. PATENT DOCUMENTS

2006/0000081 A1* 1/2006 Kondo ................... H01J 9/027
                                                          29/730
2008/0308037 A1* 12/2008 Bulovic .................... B41J 2/07
                                                          118/302
(Continued)

FOREIGN PATENT DOCUMENTS

CN       1725422       1/2006
CN       101754859     6/2010
(Continued)

OTHER PUBLICATIONS

Notice of First Review Opinion and English language translation, CN Application No. 201710526220.1, dated Dec. 18, 2019, 15 pp.
(Continued)

*Primary Examiner* — Ali Naraghi
(74) *Attorney, Agent, or Firm* — Myers Bigel, P.A.

(57) ABSTRACT

The present disclosure provides a condensing plate. The condensing plate comprises a body. The body comprises a first face and a second face opposite to the first face. The first face is provided with a condensing part and a solvent storage structure. The solvent storage structure is configured to store a solvent and release, along a direction away from the second face, gas formed by the solvent after evaporation.

16 Claims, 1 Drawing Sheet

(51) Int. Cl.
   *B41J 11/00* (2006.01)
   *B41M 7/00* (2006.01)
   *H01L 51/00* (2006.01)

(56) References Cited

U.S. PATENT DOCUMENTS

2017/0213966 A1\* 7/2017 Wang ................ H01L 51/0005
2021/0226179 A1\* 7/2021 Hsu ........................ C23C 14/12

FOREIGN PATENT DOCUMENTS

| CN | 104043573 A | 9/2014 |
| CN | 104051674 | 9/2014 |
| CN | 104908423 | 9/2015 |
| CN | 107201504 | 9/2017 |
| CN | 107940904 | 4/2018 |
| EP | 1455153 A2 | 9/2004 |
| WO | 9711328 | 3/1997 |

OTHER PUBLICATIONS

International Search Report and Written Opinion of the International Searching Authority corresponding to International Patent Application No. PCT/CN2018/084715 dated Jul. 12, 2018. (19 pages with English translation).

\* cited by examiner

CONDENSING PLATE, VACUUM DRYING DEVICE AND VACUUM DRYING METHOD

CROSS-REFERENCE TO RELATED APPLICATIONS

The present application is a 35 U.S.C. 371 national stage application of PCT International Application No. PCT/CN2018/084715, which claims the benefit of Chinese patent application No. 201710526220.1, filed on Jun. 30, 2017, the contents of which are incorporated herein by reference in their entireties.

FIELD

The present disclosure relates to the field of the manufacturing of a display device, particularly to a condensing plate, a vacuum drying device and a vacuum drying method.

BACKGROUND

The film forming method of organic electroluminescent devices, such as organic light emitting diodes (OLED), mainly includes the evaporation processes and the solution processes. The ink-jet technology belonging to the solution processes is regarded as an important way of realizing mass production of large-size organic electroluminescent devices because of its higher material utilization and ability for realizing a large size.

Currently, the process of the ink-jet technology includes an ink-jet printing (IJP) process, a vacuum drying process, and a baking process. In the vacuum drying process, the drying speed of the ink droplet on the substrate to be dried has great influence on the final morphology of the thin film. The morphology uniformity of the thin film has great influence on the lifetime and efficiency of the organic electroluminescent devices. Therefore, how to control the drying speed of the ink droplet to improve the morphology uniformity of the formed thin film is a critical issue.

SUMMARY

The present disclosure provides a condensing plate comprising a body. The body comprises a first face and a second face opposite to the first face. The first face is provided with a condensing part and a solvent storage structure, the solvent storage structure is configured to store a solvent and release, along a direction away from the second face, gas formed by the solvent after evaporation.

In an embodiment, the first face comprises a middle region and an edge region surrounding the middle region, and the solvent storage structure is arranged in the edge region.

In an embodiment, an orthographic projection of the solvent storage structure on a plane where the first face or the second face locates is an annular projection.

In an embodiment, an outer ring and an inner ring of the annular projection are rectangles.

In an embodiment, a ring width of the annular projection is in a range of 1 mm~100 mm.

In an embodiment, the solvent storage structure is a film layer comprising a plurality of adsorption pores.

In an embodiment, a material of the film layer comprises any one of silicone, polypropylene and fluorine-containing material.

In an embodiment, the body comprises a cooling channel configured to accommodate a coolant.

According to another aspect of the present disclosure, there is further provided a vacuum drying device, comprising a chamber for providing a vacuum environment, a base platform, and the condensing plate according to any of the embodiments of the present disclosure. The condensing plate and the base platform are oppositely arranged in the chamber, and the base platform is configured to carry a substrate to be dried.

In an embodiment, the base platform is further configured to heat the substrate to be dried.

In an embodiment, the first face faces the substrate to be dried.

In an embodiment, an orthographic projection of the solvent storage structure on a plane where the substrate to be dried locates is an annular projection.

In an embodiment, an outer ring of the annular projection is a rectangle, a length of the outer ring is larger than a length of a region to be dried of the substrate to be dried, and a width of the outer ring is larger than a width of the region to be dried.

In an embodiment, an inner ring of the annular projection is a rectangle, a length of the inner ring is no larger than a length of a region to be dried of the substrate to be dried, and a width of the inner ring is no larger than a width of the region to be dried.

In an embodiment, the vacuum drying device further comprises a solvent supply device. The solvent supply device is configured to supply the solvent to the solvent storage structure.

In an embodiment, the vacuum drying device further comprises a detection device configured to detect a solvent amount in a unit area of the condensing part, and a control device configured to adjust a solvent supply amount of the solvent supply device based on a detection result.

In an embodiment, the solvent supply device comprises a storage container configured to store the solvent, a supply pipeline interconnecting with the storage container and configured to supply the solvent in the storage container to the solvent storage structure, and an adjusting valve provided on the supply pipeline and configured to adjust a supply flow of the supply pipeline under control of the control device.

According to yet another aspect of the present disclosure, there is further provided a vacuum drying method, comprising:

placing a substrate to be dried on a base platform;

supplying a solvent to a solvent storage structure arranged in a body of a condensing plate, wherein the condensing plate and the substrate to be dried are arranged oppositely, and the solvent storage structure is configured to store the solvent; and heating the base platform such that the solvent on the substrate to be dried is evaporated to be condensed on the condensing plate.

In an embodiment, the vacuum drying method further comprises:

detecting a solvent amount of a unit area of a region on the body where the solvent is condensed; and adjusting an solvent supply amount supplied to the solvent storage structure in a following vacuum drying process based on a detection result, such that a difference between the solvent amount in a unit areas at a position of the region of the body where the solvent is condensed and the solvent amount in a unit area at a different position of the solvent storage structure is less than or equal to a preset value, after the following vacuum drying process.

BRIEF DESCRIPTION OF THE DRAWINGS

The drawings are used for providing further understanding to the present disclosure, which constitute a part of the specification and are used to explain the present disclosure together with the detailed description below, but not constitute any limitation to the present disclosure. In the drawings.

DETAILED DESCRIPTION

The specific embodiments of the present disclosure will be explained in detail in conjunction with the drawings. It should be understood that the specific embodiments described herein are only used for illustrating and explaining the present disclosure, rather than limiting the present disclosure.

Figure 1:
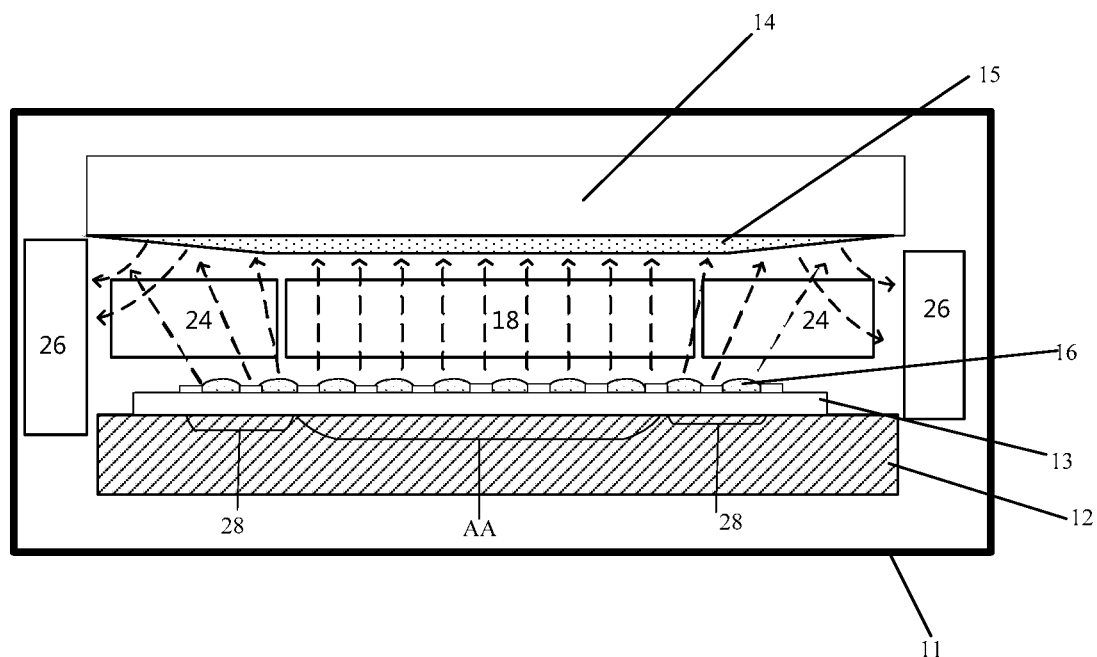
FIG. 1 is a schematic view of the common vacuum drying device when conducting the vacuum drying.

A current vacuum drying process is as shown in FIG. 1. A base platform is arranged in a chamber 11 for providing a vacuum environment. In some embodiments, the base platform can be a heating plate 12. A substrate to be dried 13 after being printed with the ink is placed above the heating plate 12. A condensing plate 14 of a lower temperature is placed at an appropriate height above the substrate to be dried 13. After the chamber 11 is vacuumized to a particular pressure, the heating plate 12 begins heating. Hence, the solvent in ink 16 on the substrate to be dried 13 begins to evaporate and is gradually captured by the condensing plate 14, and thereby forming a condensing layer 15. During the evaporation process, the middle region of the substrate to be dried 13 is in a saturated vapor region 18 of the solvent, among which the driving speeds and the drying directions respectively tend to be consistent, and the morphology uniformity of the thin film is relatively good. The edge region of the substrate to be dried 13 is located in a barometric transition region 24 between the saturated vapor region 18 and a high-vacuum region 26 of the chamber 11. The morphology uniformity of different positions on the substrate to be dried cannot be guaranteed, because the drying vacuum degree of the barometric transition region 24 differs from that of the saturated vapor region 18.

In order to ensure the morphology uniformity of a region to be dried AA (i.e., a display region for forming pixels), it has been known that a redundant pixel region 28 is arranged at the edge of the region to be dried AA. This makes the redundant pixel region 28 being placed at the barometric transition region 24, and the region to be dried AA is at the saturated vapor region 18, thereby ensuring the morphology uniformity of the film layer. The redundant pixel region 28 does not emit light and display. This is not benefit for realizing a narrow frame.

In order to at least solve one of the above technical problems, the present disclosure provides a condensing plate, a vacuum drying device and a vacuum drying method, so as to improve the morphology uniformity of the film layer formed in the vacuum drying process and reduce the influence of the frame width.

Figure 2:
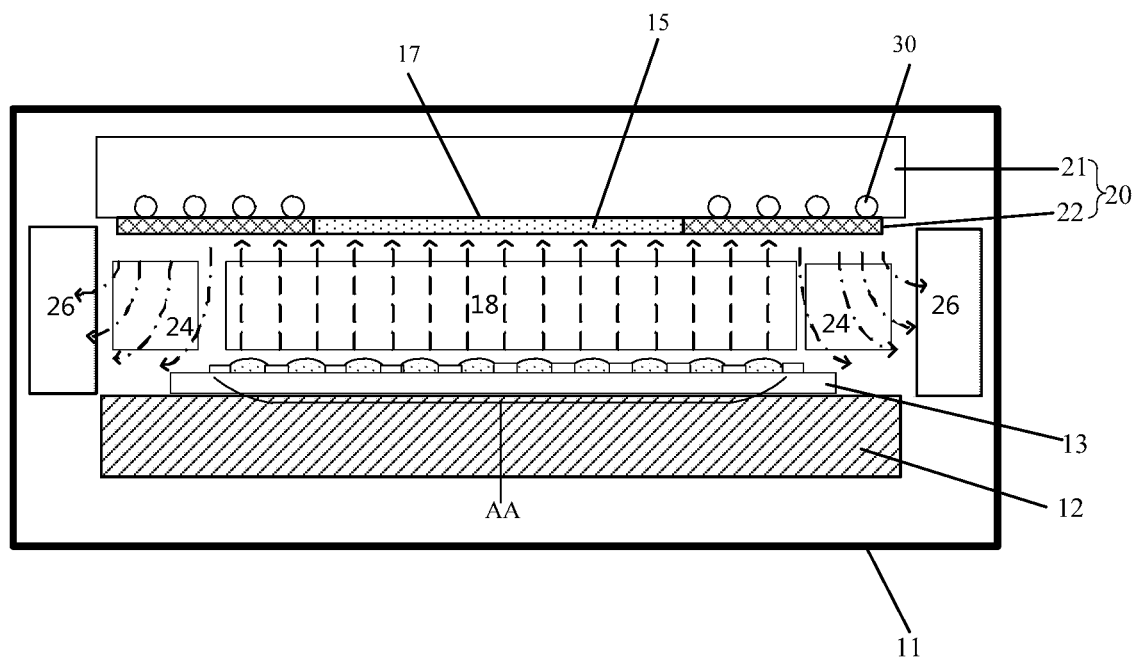
FIG. 2 is a schematic view of the vacuum drying device according to an embodiment of the present disclosure, which comprises a condensing plate, when performing the vacuum drying.

According to an aspect of the present disclosure, a condensing plate 20 is provided. As shown in FIG. 2, the condensing plate 20 is arranged opposite to the substrate to be dried 13 in the film layer drying process (e.g., the vacuum drying process), such that the solvent on the substrate to be dried 13, after evaporation, being condensed on the condensing plate 20 (specifically a condensing part 17 of the condensing plate 20) to form a condensing layer 15. The condensing plate 20 comprises a body 21. The body 21 comprises a first face and a second face arranged oppositely. The first face of the body 21 is provided with a condensing part 17 and a solvent storage structure 22. The solvent storage structure 22 is used for storing the solvent. The solvent forms gas after evaporation and the gas is released towards the substrate to be dried 13.

The position of the solvent storage structure 22 on the body 21 can be set based on the position of the substrate to be dried 13 in the chamber 11 in the film layer drying process, so that the solvent storage structure 22 faces a part of the substrate to be dried 13 close to the high vacuum region 26. In an example, the body 21 and the substrate to be dried 13 are located in the middle part of the chamber 11. The substrate to be dried 13 is surrounded by the high vacuum region 26. In that situation, the solvent storage structure 22 can be arranged in regions close to the four edges of the bottom of the body 21. For example, the solvent storage structure 22 is located on the face of the body 21 facing towards the substrate to be dried and close to four edges of this face, or the solvent storage structure 22 is arranged around the four side faces of the body 21. In another example, the body 21 and the substrate to be dried 13 are arranged closely adjacent to an inner wall of the chamber 11. In that situation the solvent storage structure 22 can be arranged at positions close to the three edges of the bottom of the body 21 away from the inner wall of the chamber 11. For example, the solvent storage structure 22 is located on the face of the body 21 facing towards the substrate to be dried and close to three edges of this face away from the inner wall of the chamber 11, or, is arranged surrounding the three side faces of the body 21 away from the inner wall of the chamber 11.

When a conventional condensing plate 14 is applied in the vacuum drying process, the middle of the substrate to be dried 13 is away from the high vacuum region 26, such that the solvent is in a region comprising a lot of vapor, or even saturated vapor region 18. The evaporation speeds tend to be consistent and the evaporation directions are the same. The edge of the substrate to be dried 13 is in the barometric transition region 24 of a lower vapor pressure. When the solvent at this part evaporates upwards, a side close to the high vacuum region 26 is not protected by the gas environment, so that the evaporated gas will tend to move to the surrounding high vacuum region 26 while rising, thereby the evaporation speeds and the evaporation directions of the solvent in the middle and the solvent at the edge of the substrate to be dried 13 are respectively different.

In some embodiments of the present disclosure, since the body 21 is provided with the solvent storage structure 22 that corresponds to the part of the substrate to be dried 13 close to the high vacuum region 26 and stores certain solvent, when performing vacuum drying process to the substrate to be dried 13, the solvent in the solvent storage structure 22 will evaporate in a direction away from the second face under the vacuum condition, thereby forming a gas environment under the solvent storage structure 22. When the outer edge of the solvent storage structure 22 exceeds the outer edge of the substrate to be dried 13, the gas environment formed by the solvent storage structure 22 will surround the region to be dried AA of the substrate to be dried 13, as the barometric transition region 24. The barometric transition region 24 divides the region to be dried AA from the vacuum atmosphere, such that all of the solvent in the region to be dried AA of the substrate to be dried 13 is in a region containing higher amount of vapor or even saturated vapor region 18. This makes the drying environments of the ink droplets across the region to be dried AA consistent, so that the morphology uniformity of the film layer in the region to be dried AA is better, and reduce or even eliminate the redundant pixel region, thereby simultaneously improving the morphology uniformity of the film layer and reducing the influence on the narrow frame.

In order to facilitate the solvent storage structure 22 to be stably arranged on the body 21, in some embodiments, as shown in FIG. 2, the solvent storage structure 22 can be arranged on the side of the body 21 facing towards the substrate to be dried 13.

In order to enable the solvent storage structure 22 to store certain amount of solvent, and enable the gas evaporated by the solvent to be released towards the substrate to be dried 13, in some embodiments, the solvent storage structure 22 can be a film layer comprising a plurality of adsorption pores. The solvent is adsorbed into the adsorption pores.

In order to prevent the solvent storage structure 22 from being corroded by organic solvent after being used for a long time, in some embodiments, the film layer uses materials resistant to organic solvent corrosion, including any one of silicone, polypropylene and fluorine-containing materials.

Normally, during the vacuum drying process, the substrate to be dried 13 is positioned at the middle part of the chamber, i.e., the substrate to be dried 13 is surrounded by the high vacuum region 26. In that situation, the body 21 comprises a middle region and an edge region surrounding the middle region. The condensing part 17 is arranged in the middle region, and the solvent storage structure 22 is arranged in the edge region. In some embodiments, the solvent storage structure 22 may also cover an entire surface of the body 21 facing towards the substrate to be dried 13, as long as it is guaranteed that the solvent condensed in the corresponding part of the body 21 above the region to be dried AA of the substrate to be dried 13 is distributed uniformly.

The orthographic projection of the solvent storage structure 22 on a plane where the bottom of the body 21 locates is an annular projection. Since the plane where the bottom of the body 21 locates is substantially parallel with the plane where the substrate to be dried locates, the orthographic projection of the solvent storage structure 22 on the plane where the substrate to be dried 13 locates is accordingly an annular projection, particularly an annular projection surrounding the region to be dried AA. When the solvent in the solvent storage structure 22 evaporates, the periphery of the region to be dried AA is surrounded by the gas environment and is separated from the high vacuum region 26. This further improves uniformity of the film layer. The plane where the body 21 locates can be recognized as the plane where the face of the body 21 facing towards the substrate to be dried 13 locates, and can also be recognized as the plane where the face of the body 21 away from the substrate to be dried 13 locates.

Normally, the region to be dried AA of the substrate to be dried 13 is a rectangle. Correspondingly, the outer ring and the inner ring of the annular projection are both rectangles. The length of the rectangular outer ring is larger than the length of the region to be dried AA, and the width of the rectangular outer ring is larger than the width of the region to be dried AA. Therefore, it is ensured that, when the solvent of the region to be dried AA evaporates, the periphery of the region to be dried AA can be surrounded by the vapor formed by evaporation of the solvent in the solvent storage structure 22 above, thereby ensuring that the evaporation directions and the evaporation rates of the solvent at anywhere of the region to be dried AA are respectively consistent.

In addition, the length of the rectangular inner ring is no larger than the length of the region to be dried AA, and the width of the rectangular inner ring is no larger than the width of the region to be dried AA, such that the gas environment formed by evaporation of the solvent of the region to be dried AA and the gas environment formed by evaporation of the solvent in the solvent storage structure 22 above is gapless. The difference between the length of the rectangular inner ring and the length of the region to be dried AA is in a range of 0~600 μm. The difference between the width of the rectangular inner ring and the width of the region to be dried AA is in a range of 0~600 μm.

Further, the ring width (i.e., the distance between the inner ring and the outer ring) of the annular projection is in a range of 1 mm~100 mm, such that when the solvent in the solvent storage structure 22 is evaporated, a wide enough gas region is generated around the region to be dried AA of the substrate to be dried 13, and better surround the gas formed by evaporation of the solvent of the region to be dried AA to prevent the solvent of the region to be dried AA from being evaporated toward the high vacuum region 26.

In order to enable the solvent on the substrate to be dried 13 to be condensed quickly on the condensing plate after evaporation to keep the air pressure above the substrate to be dried 13 stable, a cooling channel can be provided in the body 21 to accommodate the coolant.

As another aspect of the present disclosure, there is provided a vacuum drying device, as shown in FIG. 2, comprising a chamber 11 for providing a vacuum environment, a base platform and the condensing plate 20 according to an embodiment of the present disclosure. The base platform is used for carrying the substrate to be dried 13. In some embodiments, the base platform can be a heating plate 12. The condensing plate 20 and the heating plate 12 are both arranged in the chamber 11 for providing the vacuum environment. The heating plate 12 and the condensing plate 20 are arranged oppositely. The heating plate 12 is used to carry and heat the substrate to be dried 13. In some embodiments, the heating plate 12 can comprise a carrying plate and a heating device arranged within the carrying plate.

The condensing plate 20 comprises a first face and a second face arranged opposite to the first face. Since the first face of the condensing plate 20 comprises a solvent storage structure 22, when performing the vacuum drying process, certain solvent can be stored in the solvent storage structure 22. The gas formed by the solvent after evaporation can be released to the substrate to be dried 13 in a direction away from the second face. Hence, in the vacuum drying process, a gas atmosphere is generated under the solvent storage structure 22, such all of the solvent in the region to be dried AA of the substrate to be dried 13 being in a region comprising a relatively larger amount of vapor or even a saturated vapor region 18, thereby making the environment of the drying of the ink droplet in the region to be dried AA consistent and the morphology uniformity of the film layer in the region to be dried AA better, and reducing or even eliminating the redundant pixel region thereby improving the morphology uniformity of the film layer while reducing the influence on the narrow frame.

In some embodiments, the heating plate 12 and the condensing plate 20 can be arranged in the middle of the chamber 11 so that the heating plate 12 and the condensing plate 20 are surrounded by the high vacuum region 26 in its all around. Correspondingly, as mentioned above, the solvent storage structure 22 is arranged in a region close to the four edges of the bottom of the body 21.

In addition, the vacuum drying device further comprises a solvent supply device, a detection device and a control device (none of which is shown). The solvent supply device is used for supplying solvent to the solvent storage structure 22. The detection device is used for detecting the solvent amount of a unit area in the region on the body 21 where the solvent condenses. As mentioned above, the solvent storage structure 22 is arranged in a region close to the four edges of the bottom of the body 21. In that situation, the detection device is used for detecting the solvent amount in a unit area on the solvent storage structure 22 and the solvent amount in a unit area of the middle region (such as the solvent amount in a unit area of the condensing layer 15 as in FIG. 2). The control device is used for adjusting the solvent supply amount of the solvent supply device based on the detection result of the detection device. Specifically, the solvent amount supplied to a unit area of the solvent storage structure 22 for the $(N+1)^{th}$ round can be controlled based on the solvent amount in a unit area of the solvent storage structure 22 after the $N^{th}$ round vacuum drying process is finished, such that, in the $(N+1)^{th}$ round of drying process, the solvent amount in the unit area of the middle region of the body 21 is substantially the same as the solvent amount in the unit area on the solvent storage structure 22, and the solvent at the two places is respectively distributed uniformly, such that the atmosphere of the edge of the region to be dried AA of the substrate to be dried 13 is consistent with the atmosphere of the middle of the region to be dried AA of the substrate to be dried 13, which further ensuring the consistency of the evaporation speeds and the evaporation directions. In another embodiment, after the $N^{th}$ round of the vacuum drying process is finished, when the solvent amount of the unit area of the middle region of the body 21 is less than the solvent amount of the unit area of the solvent storage structure 22, the solvent supply amount of the solvent supply device of the $(N+1)^{th}$ round of the vacuum drying process can be reduced. Contrarily, when the solvent amount of the unit area of the middle region of the body 21 is more than the solvent amount of the unit area of the solvent storage structure 22, the solvent supply amount of the solvent supply device in the $(N+1)^{th}$ round of vacuum drying process can be increased, such that, after each round of vacuum drying process, the solvent amount in the unit area of the solvent storage structure 22 is substantially the same as the solvent amount in the unit area of the middle region of the body 21 (this can also be regarded as a consistency of the thickness of the condensing layer 15 of the middle region and the depth of the solvent in the solvent storage structure 22), such that the solvent in the entire region on the body 21 is distributed uniformly.

As mentioned above, the solvent storage structure 22 can cover the entire face of the body 21 facing towards the substrate to be dried 13. In such a case, due to the mobility of the solvent, the solvent on the body 21 is distributed uniformly. Hence, what is needed is to provide sufficient amount of solvent to the solvent storage structure 22 before each round of vacuum drying process. The solvent amount provided should ensure that, in the drying process, there is always solvent residual in the solvent storage structure 22.

The solvent supply device can specifically comprise a storage container, a supply pipeline 30 and an adjusting valve. The storage container is used for storing the solvent. The supply pipeline 30 is interconnected with the storage container and is used for supplying the solvent in the storage container to the solvent storage structure 22. As shown in FIG. 2, a groove can be arranged on the body 21, and a part of the supply pipeline 30 is arranged in the groove. The supply pipeline 30 supplies solvent to the solvent storage structure 22 from the top of the solvent storage structure 22. The adjusting valve is arranged on the supply pipeline 30 for regulating the supply flow of the supply pipeline 30 under the control of the control device.

As a further aspect of the present disclosure, there is provided a vacuum drying method conducted by means of the above vacuum drying device. Referring to FIG. 2, the vacuum drying method comprises performing the following steps during each vacuum drying process:

placing a substrate to be dried 13 on a base platform;

supplying a solvent to a solvent storage structure 22 arranged in a body 21 of a condensing plate 20, wherein the condensing plate 20 and the substrate to be dried 13 are arranged oppositely, and the solvent storage structure 22 is configured to store the solvent; and heating the base platform, such that the solvent in the ink on the substrate to be dried 13 to be evaporated so as to be condensed on the condensing plate 20.

In some embodiments, the base platform can be a heating plate 12. Since the heating plate 12 is heated, the solvent in the ink on the substrate to be dried 13 evaporates quickly, so that the ink on the substrate to be dried 13 is dried to form a film layer.

A person having ordinary skill in the art should understand that the performing order of the steps of the method provided by the present disclosure is not limited to the described order.

In order to form a protective environment around the region to be dried AA of the substrate to be dried 13 in the vacuum drying process, the region to be dried AA is separated from the high vacuum region 26. When placing the substrate, the outer periphery of the solvent storage structure 22 can exceed the edge of the region to be dried AA of the substrate to be dried 13. The solvent in the solvent storage structure 22 is evaporated to generate certain gas atmosphere. By means of the above arrangement, all of the solvent of the region to be dried AA of the substrate to be dried 13 is in the saturated vapor region 18, such that the drying environments of the ink droplets of the region to be dried AA being consistent. As a result, the morphology uniformity of the film layer in the region to be dried AA is better, and the redundant pixel region is reduced or even eliminated, thereby improving uniformity of the film layer while reducing the influence to the narrow frame.

Moreover, the above method can further comprise, injecting a coolant into the cooling channel within the body 21 of the condensing plate 20 before heating the base platform.

Furthermore, in order to further ensure the consistency of the evaporation speeds and the consistency of the evaporation directions of the solvent on the substrate to be dried 13, the vacuum drying method can further comprise:

after a round of the vacuum drying process is finished, detecting a solvent amount in a unit area of a region on the body 21 where the solvent condenses; and adjusting an solvent supply amount supplied to the solvent storage structure by the solvent supply device in the next round of the vacuum drying process by the control device based on the detection result of the detection device, such that after the next round of the vacuum drying process, a difference between the solvent amount in a unit areas at a position of the region of the body where the solvent is condensed and the solvent amount in a unit area at a different position of the solvent storage structure does not to exceed a preset value. The preset value can be set as a value slightly larger than zero. That is, in a corresponding region of the body 21 above the region to be dried AA of the substrate to be dried 13, the solvent is distributed uniformly.

To sum up, the present disclosure provides a condensing plate. The condensing plate comprises a body. The body comprises a first face and a second face opposite to the first face. The first face is provided with a condensing part and a solvent storage structure. The solvent storage structure is configured to store solvent and release, along a direction away from the second face, gas formed by the solvent after evaporation Correspondingly, the present disclosure further provides a vacuum drying device and a vacuum drying method.

In the present disclosure, the condensing plate comprises a solvent storage structure, and certain solvent can be stored in the solvent storage structure. When performing the vacuum drying process, after the solvent evaporates in the vacuum environment, the resulting gas can be released to the substrate to be dried. Hence, in the vacuum drying process, a certain gas atmosphere is generated under the solvent storage structure so that all of the solvent of the region to be dried of the substrate to be dried is in a region containing a lot of vapor or even the saturated vapor region. This enables the drying environment of the ink droplets on the region to be dried to be consistent, so that the morphology uniformity of the film layer in the region to be dried is better. Meanwhile, the redundant pixel region is reduced or even eliminated, thereby reducing the influence to the narrow frame while improving uniformity of the film layer.

It could be understood that the above embodiments are only exemplary implementation used for explaining the principle of the present disclosure. However, the present disclosure is not limited to this. It will be obvious to those skilled in the art that changes and modifications may be made without departing from the spirit and substance of this disclosure and such changes and modifications are fall within the protective scope of this invention.

LIST OF REFERENCE SIGNS

11: chamber
12: heating plate
13: substrate to be dried
14: common condensing plate
15: condensing layer
16: ink
17: condensing part
18: saturated vapor region
24: barometric transition region
26: high vacuum region
AA: region to be dried
28: redundant pixel region
20: condensing plate according to an embodiment of the present disclosure
21: body
22: solvent storage structure
30: supply pipeline

I claim:

1. A condensing plate, comprising:
a body comprising a first face, a second face opposite to the first face, and a cooling channel configured to accommodate a coolant,
wherein the first face comprises a condensing part and a solvent storage structure,
wherein the solvent storage structure is configured to store a solvent, evaporate the solvent, and release gas formed by the solvent after evaporation, wherein the gas is released along a direction from the second face to the first face.

2. The condensing plate of claim 1,
wherein the first face comprises a middle region and an edge region surrounding the middle region, and
wherein the solvent storage structure is in the edge region.

3. The condensing plate of claim 2, wherein an orthographic projection of the solvent storage structure on a plane of the first face or the second face comprises an annular projection.

4. The condensing plate of claim 3, wherein an outer ring and an inner ring of the annular projection are rectangles.

5. The condensing plate of claim 3, wherein a ring width of the annular projection is in a range of 1 mm to 100 mm.

6. The condensing plate of claim 1, wherein the solvent storage structure comprises a film layer comprising a plurality of adsorption pores.

7. The condensing plate of claim 6, wherein a material of the film layer comprises one of silicone, polypropylene or fluorine-containing material.

8. A vacuum drying device, comprising:
a chamber configured to provide a vacuum environment,
a base platform, and
the condensing plate according to claim 1,
wherein the condensing plate is opposite the base platform in the chamber, and
wherein the base platform is configured to carry a substrate to be dried.

9. The vacuum drying device of claim 8, wherein the base platform is further configured to heat the substrate for drying.

10. The vacuum drying device of claim 8, wherein the first face faces the substrate for drying.

11. The vacuum drying device of claim 8, wherein an orthographic projection of the solvent storage structure on a plane of the substrate comprises an annular projection.

12. The vacuum drying device of claim 11,
wherein an outer ring of the annular projection comprises a rectangle,
wherein a length of the outer ring is greater than a length of a region for drying of the substrate, and
wherein a width of the outer ring is greater than a width of the region for drying.

13. The vacuum drying device of claim 11,
wherein an inner ring of the annular projection comprises a rectangle,
wherein a length of the inner ring is less than a length of a region for drying of the substrate, and
wherein a width of the inner ring is less than a width of the region for drying.

14. The vacuum drying device of claim 8, further comprising:
a solvent supply device,
wherein the solvent supply device is configured to supply the solvent to the solvent storage structure.

15. The vacuum drying device of claim 14, further comprising:
- a detection device configured to detect a solvent amount in a unit area of the condensing part; and
- a control device configured to adjust a solvent supply amount of the solvent supply device based on a detection result.

16. The vacuum drying device of claim 15, wherein the solvent supply device comprises:
- a storage container configured to store the solvent;
- a supply pipeline interconnecting with the storage container and configured to supply the solvent in the storage container to the solvent storage structure; and
- an adjusting valve on the supply pipeline and configured to adjust a supply flow of the supply pipeline under control of the control device.

* * * * *